United States Patent
Li et al.

(10) Patent No.: US 9,497,058 B2
(45) Date of Patent: *Nov. 15, 2016

(54) HIGH EFFICIENCY ADAPTIVE RF TRANSMITTER

(71) Applicant: Aviacomm Inc., Sunnyvale, CA (US)

(72) Inventors: Tao Li, Campbell, CA (US); Hans Wang, Mountain View, CA (US); Binglei Zhang, San Jose, CA (US); Shih Hsiung Mo, San Jose, CA (US)

(73) Assignee: AVIACOMM INC., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/085,599

(22) Filed: Nov. 20, 2013

(65) Prior Publication Data

US 2014/0146919 A1    May 29, 2014

Related U.S. Application Data

(60) Provisional application No. 61/730,008, filed on Nov. 26, 2012.

(51) Int. Cl.
| | |
|---|---|
| H04K 1/02 | (2006.01) |
| H04L 27/26 | (2006.01) |
| H03F 1/02 | (2006.01) |
| H03F 1/32 | (2006.01) |
| H03F 3/24 | (2006.01) |

(52) U.S. Cl.
CPC ......... *H04L 27/2614* (2013.01); *H03F 1/0266* (2013.01); *H03F 1/32* (2013.01); *H03F 3/24* (2013.01); *H04L 27/2627* (2013.01); *H03F 2200/435* (2013.01); *H03F 2201/3203* (2013.01)

(58) Field of Classification Search
CPC ............ H04B 1/00; H04B 3/00; H04B 7/00; H04B 14/00; H04B 17/00; H04B 2001/00; H04B 2201/00; H04J 13/00; H04J 2013/00; H03K 7/00; H03K 9/00; H03L 7/00; H04L 1/00; H04L 5/00; H04L 7/00; H04L 25/00; H04L 27/00; H04L 2001/00; H04L 2007/00; H04L 2025/00; H04L 2027/00; H03M 5/00
See application file for complete search history.

(56) References Cited

U.S. PATENT DOCUMENTS

| | | | | |
|---|---|---|---|---|
| 6,944,469 | B2* | 9/2005 | Jo et al. | 455/522 |
| 8,364,101 | B2* | 1/2013 | Shizawa | H03F 1/0222 375/297 |
| 2003/0022639 | A1* | 1/2003 | Hongo | H04L 27/2623 455/116 |
| 2004/0218689 | A1* | 11/2004 | Akhtman | 375/296 |
| 2011/0316623 | A1* | 12/2011 | Bohn | H03F 1/0227 330/127 |
| 2013/0078929 | A1* | 3/2013 | Khoury | H04L 25/0284 455/73 |

* cited by examiner

*Primary Examiner* — Adolf Dsouza
(74) *Attorney, Agent, or Firm* — Shun Yao; Park, Vaughan, Fleming & Dowler LLP

(57) ABSTRACT

One embodiment of the present invention provides a system for controlling operations of an amplifier in a wireless transmitter. During operation, the system receives a baseband signal to be transmitted, and dynamically switches an operation mode of the amplifier between a high power back-off mode having a first power back-off factor and a normal mode having a second power back-off factor based on a level of the baseband signal.

20 Claims, 4 Drawing Sheets

HIGH EFFICIENCY ADAPTIVE RF TRANSMITTER

RELATED APPLICATION

This application claims the benefit of U.S. Provisional Application No. 61/730,008, entitled "High Efficiency Adaptive RF Transmitter," by inventors Tao Li, Hans Wang, Binglei Zhang, and Shih Hsiung Mo, filed 26 Nov. 2012.

BACKGROUND

1. Field

The present disclosure relates generally to a transmitter used for transmitting orthogonal frequency-division multiplexing (OFDM) modulated signals. More specifically, the present disclosure relates to a transmitter equipped with an adaptive power amplifier driver that is capable of achieving high efficiency when pre-amplifying OFDM-modulated signals.

2. Related Art

Orthogonal frequency-division multiplexing (OFDM) technology has become more and more popular in recent years because of its many advantages, including frequency efficiency and robustness against frequency-selective channel fading in the tough wireless environment. During the past decade, OFDM has become the basis of many standards, such as Wi-Fi, Worldwide Interoperability for Microwave Access (WiMAX), Digital Video Broadcasting (DVB), Long Term Evolution (LTE), TV White Space (TVWS), etc.

However, OFDM also suffers from some drawbacks. One important problem is the high peak-to-average power ratio (PAPR) of the transmitted signal. The high peak can result in saturation of the power amplifiers (PAs), leading to non-linear signal distortion. To prevent the non-linear distortion, conventional approaches rely on keeping the power amplifier working in the linear range by backing-off the output power of the amplifier entirely to accommodate the high peaks. Such approaches can result in either a low signal-to-noise ratio (SNR) or an oversized and inefficient power amplifier (PA). Moreover, to ensure the linearity of the transmitted signals, other transmitter components, such as low-pass filters (LPFs), variable gain amplifiers (VGAs), mixers, and PA drivers, have to work in the high-linearity, low-power-efficiency mode.

SUMMARY

One embodiment of the present invention provides a system for controlling operations of an amplifier in a wireless transmitter. During operation, the system receives a baseband signal to be transmitted, and dynamically switches an operation mode of the amplifier between a high power back-off mode having a first power back-off factor and a normal mode having a second power back-off factor based on a level of the baseband signal.

In a variation on this embodiment, the system converts the baseband signal from a digital domain to an analog domain; modulates the converted baseband signal; and amplifies, by the pre-amplifier, the modulated signal.

In a variation on this embodiment, while dynamically switching the operation mode of the amplifier, the system determines whether a level of the baseband signal exceeds a predetermined threshold. If so, the system places the amplifier in the high power back-off mode; if not, the system places the amplifier in the normal mode.

In a further variation, placing the amplifier in the high power back-off mode involves increasing a bias voltage or a bias current of the pre-amplifier.

In a variation on this embodiment, a difference between the first power back-off factor and the second power back-off factor is determined by a peak-to-average power ratio (PAPR) of the baseband signal.

In a variation on this embodiment, the amplifier is a power amplifier (PA) driver, and the PA driver is located on an RF integrated circuit (IC) chip that comprises at least a modulator.

In a variation on this embodiment, the baseband signal includes an orthogonal frequency-division multiplexing (OFDM) symbol.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide an OFDM transmitter that can adaptively adjust the operating mode of the transmitter components, such as a PA driver, located on an RF IC chip based on the level of the transmitted signal. More specifically, when the level of the baseband signal is high, the PA driver is placed in a low-power-efficiency mode by increasing its bias voltage to ensure that the high-level signal is not distorted. Once the signal level returns to a normal range, the PA driver returns to its normal high-power-efficiency mode, thus providing higher power efficiency overall. Because the decision is made based on the baseband signal, a slow transition between the two operating modes of the PA driver is sufficient to meet the needs of the system.

OFDM Transmitter with Adaptive PA Driver

In OFDM systems, the high PAPR value is a result of the superposition of many independent subcarriers, and is directly proportional to the number of subcarriers. More specifically, the PAPR of an OFDM system can be given by: PAPR(dB)=10 log(N), where N is the number of subcarriers. For example, the OFDM-based standard 802.11 a/g specifies the number of OFDM subcarriers as 52. When the phases of all 52 subcarriers are lined up during a symbol period, the PAPR is 17 dB. To accommodate such a high peak while maintaining linearity, that is to provide gain without compression at every possible peak, the operating point of a power amplifier (PA) needs to back-off 17 dB from the peak-power handling point. Such a large power back-off factor means that the PA has to be oversized in terms of its average power requirements.

In addition, a pre-amplifier or a PA driver is often needed to provide sufficient input power (often around 0 dBm) to the PA. The large PAPR means that the PA driver also needs to have a large power back-off factor and, thus work in a low-power-efficiency mode. This reduced power efficiency can be a huge problem for battery-powered portable devices (such as laptops or tablets) and mobile devices (such as smartphones).

Figure 1:
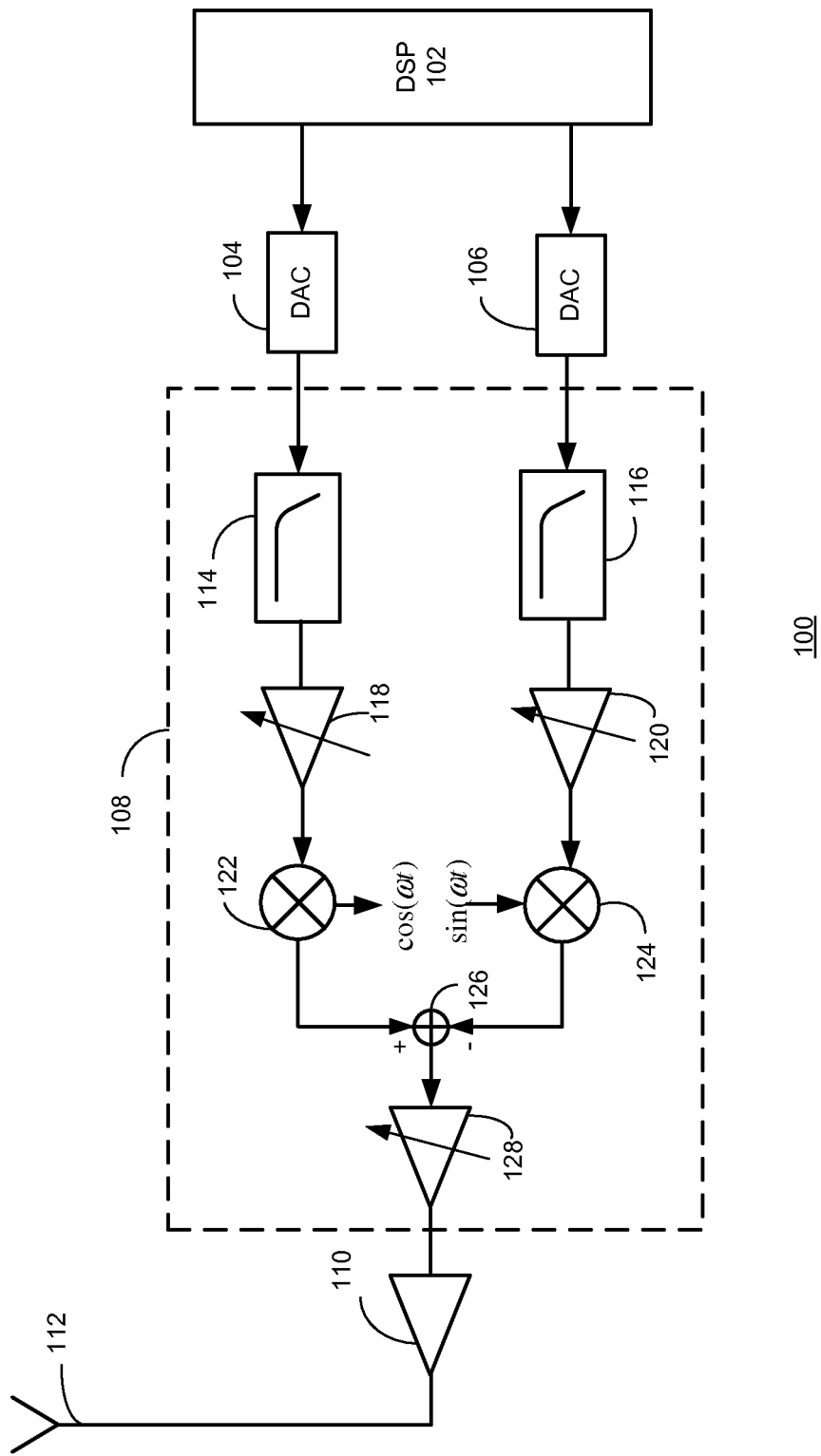
FIG. 1 presents a diagram illustrating the architecture of a conventional wireless transmitter.

FIG. 1 presents a diagram illustrating the architecture of a conventional wireless transmitter. In FIG. 1, transmitter 100 includes a baseband digital signal processor (DSP) 102, digital-to-analog converters (DACs) 104 and 106, a radio frequency integrated circuit (RFIC) chip 108, a power amplifier 110, and an antenna 112. RFIC chip 108 includes LPFs 114 and 116, variable gain amplifiers (VGAs) 118 and 120, mixers 122 and 124, an adder 126, and a power-amplifier driver 128.

During operation, baseband DSP 102 outputs I and Q channel baseband digital signals to DACs 104 and 106, respectively, which convert the digital signals to analog signals. The converted analog signals are then filtered and amplified by LPFs 114-116 and VGAs 118-120, respectively. The amplified I and Q baseband signals are then modulated by a modulator, which includes mixers 122-124 and adder 126. Note that other standard components of the modulator, such as the local oscillator and the phase shifter, are not shown in FIG. 1. The modulated signal is sent to power-amplifier driver 128 for pre-amplification, and then to power amplifier 110. After amplification by PA 110, the modulated signal is transmitted via antenna 112.

As previously discussed, when designing the transmitter, it is very difficult to simultaneously meet the linearity and power efficiency requirements, especially for OFDM signals having high PAPR. Satisfying the linearity requirement often means sacrificing power efficiency, and vice versa. To resolve such a conflict, in embodiments of the present invention, the operating point of the various transmitter components (including the VGAs and the PA driver) can be adjusted dynamically according to the level of the baseband signal to be transmitted, in order to simultaneously meet the linearity requirement and achieve an overall high efficiency. More specifically, in embodiments of the present invention, the PA driver and the VGAs can be configured to work at a high power back-off mode only when the system determines that the overall or average power level of a chunk of to-be-transmitted baseband signals exceeds a threshold value; otherwise, these transmitter components are configured to work at a normal mode, which does not require power back-off. While working in the high power back-off mode, the PA driver and the VGAs may consume a larger amount of DC power to ensure linearity of the amplified signal, whereas while working at the normal mode, the PA driver and the VGAs consume less DC power.

Figure 2:
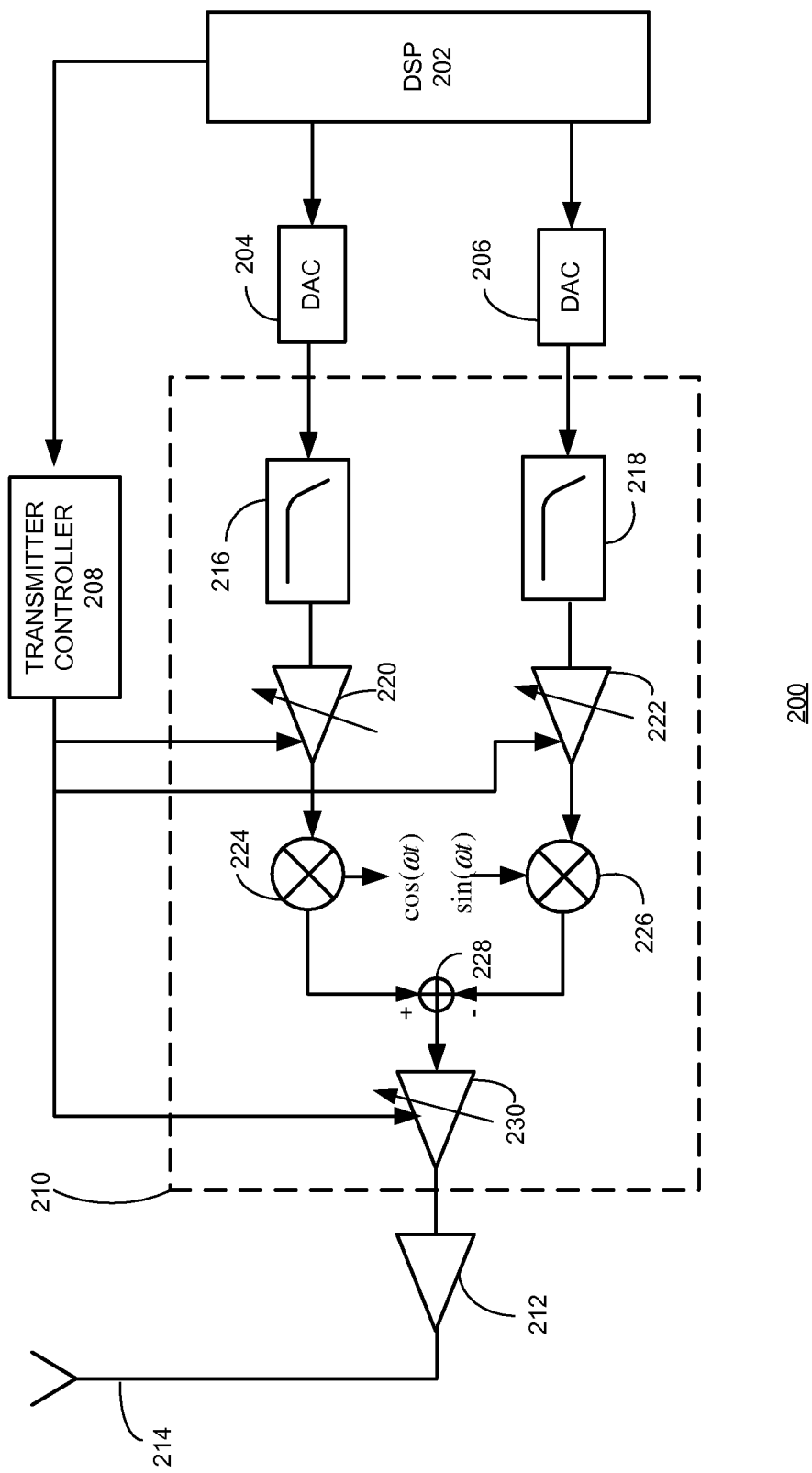
FIG. 2 presents a diagram illustrating the architecture of a wireless transmitter, in accordance with an embodiment of the present invention.

FIG. 2 presents a diagram illustrating the architecture of a wireless transmitter, in accordance with an embodiment of the present invention. In FIG. 2, transmitter 200 includes a baseband digital signal processor (DSP) 202, digital-to-analog converters (DACs) 204 and 206, a transmitter controller 208, a radio frequency integrated circuit (RFIC) chip 210, a power amplifier (PA) 212, and an antenna 214. RFIC chip 210 includes LPFs 216 and 218, variable gain amplifiers (VGAs) 220 and 222, mixers 224 and 226, an adder 228, and a PA driver 230.

During operation, baseband DSP 202, DACs 204 and 206, RFIC chip 210, PA 212, and antenna 214 perform various functions that are similar to the ones in the conventional transmitter shown in FIG. 1, including generating I and Q baseband signals, DA-converting the I/Q signals, filtering, modulating, amplifying, and transmitting the modulated radio signals. In addition, baseband DSP 202 also interacts with transmitter controller 208, which controls the operations of a number of components located on RFIC chip 210, such as PA driver 230 and VGAs 220 and 222, based on the level of the baseband signal.

More specifically, before transmitting a chunk of baseband signals, transmitter controller 208 determines whether the chunk of baseband signals includes a peak that is sufficiently high (such as exceeding a threshold value) based on the overall (including both I and Q channels) signal level. If so, it will move the operating point of PA driver 230 and/or VGAs 220 and 222 to a point that results in PA driver 230 and/or VGAs 220 and 222 working in a high power back-off mode. In one embodiment, transmitter controller 208 adjusts the bias voltage of PA driver 230 to a higher level in order to have PA driver 230 working in the high power back-off mode. Similarly, transmitter controller 208 can adjust the bias voltage of one or more VGAs, such as VGAs 220 and 222, to a higher level to place the VGAs in the high power back-off mode. Note that in order to determine whether a peak exists, transmitter controller 208 may calculate the average signal level or the PAPR of the chunk of the baseband signals. Note that an increased average signal level often indicates the presence of a peak. After the transmission of the peak and when the level of the baseband signal returns to its normal range, transmitter controller 208 will then reset the operating point of PA driver 230 and/or one or more VGAs to their normal operating point. As discussed earlier, PA driver 230, as well as the VGAs, will suffer from lower energy efficiency while working in the high power back-off mode, because a higher bias voltage means higher DC power consumption. However, this arrangement is more advantageous than placing PA driver 230 and the VGAs in the high power back-off mode constantly. For an OFDM system the possibility of the transmitted signal level being much larger than the average level of all signals is relatively low, meaning that most of the time the signal level remains close to or lower than the average level. Consequently, PA driver 230 and the VGAs only need to work in this high power back-off, thus low power efficiency, mode for a small percentage of time. Therefore, the overall efficiency can still remain high.

For example, in a typical OFDM system, 95% of the time the level of the signal remains close to or lower than the average level with the PAPR being much lower than 10 dB, whereas only during the remaining 5% of the time does the PAPR of the signal exceed 10 dB. Consequently, the transmitter components, such as the PA driver and the VGAs, can be placed in the normal working mode 95% of the time, and only need to be placed in the high power back-off mode with at least 10 dB power back-off factor 5% of the time. This means that the efficiency of the PA driver and the VGAs remains high 95% of the time and only drops to a lower value during the remaining 5% of the time. As a result, the overall efficiency can still be high.

Figure 3:
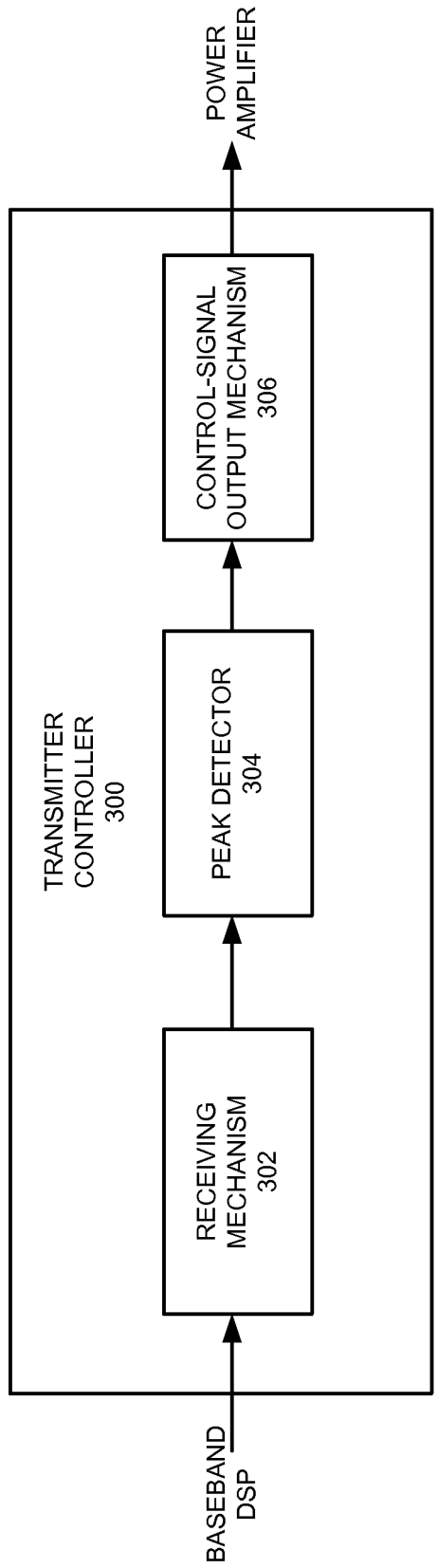
FIG. 3 presents a diagram illustrating the architecture of an exemplary transmitter controller, in accordance with an embodiment of the present invention.

FIG. 3 presents a diagram illustrating the architecture of an exemplary transmitter controller, in accordance with an embodiment of the present invention. In FIG. 3, transmitter controller 300 includes a receiving mechanism 302, a peak detector 304, and a control-signal output mechanism 306.

Receiving mechanism 302 is responsible for receiving information associated with the level of the baseband signals from the baseband DSP, which is the one responsible for generating the baseband signals. If the modulation scheme is quadrature modulation, the overall signal level is determined by both the I channel signal and the Q channel signal. More specifically, the amplitude of the overall signal can be given as: $A=\sqrt{I^2+Q^2}$, where A is the amplitude of the overall signal, I is the amplitude of the I channel signal, and Q is the amplitude of the Q channel signal. Note that the I and Q signals remain in the digital domain in the baseband DSP; hence, the signal level is also calculated in the digital domain as a digital value. In one embodiment, receiving mechanism 302 receives signal-level information for a chunk or a block of baseband signals. In a further embodiment, the baseband signals include OFDM-modulated signals.

Peak detector 304 detects the existence of signal peaks that may require that the PA driver and/or VGAs be placed in the high power back-off mode. In one embodiment, peak detector 304 detects a peak by determining whether the overall signal level for a particular to-be-transmitted symbol exceeds a predetermined threshold. In one embodiment, instead of calculating the overall level for a particular to-be-transmitted symbol, peak detector 304 may calculate a moving average of the to-be-transmitted symbols by calculating the average level of a block of to-be-transmitted symbols. Note that an increased average signal level often indicates an incoming peak within the block of symbols. Once a peak is detected, peak detector 304 instructs control-signal output mechanism 306 to output a control signal that places the PA driver and/or one or more VGAs in the high power back-off mode. In a further embodiment, peak detector 304 calculates the PAPR of the to-be-transmitted block of symbols. Note that the size of the block can be predefined, and there is a tradeoff between the size of the block and the overall power efficiency. If the size of the block is too large, then detection of a single peak may result in the entire block being transmitted at the high power back-off mode. On the other hand, a smaller block means that only a small number of symbols before and after the peak will be transmitted at the high power back-off mode. However, a smaller block means that peak detector 304 has to perform the signal-level detection function more frequently, and that the PA driver may have to adjust its operating mode more frequently. If peak detector 304 detects that the PAPR of the to-be-transmitted block of symbols exceeds a predetermined threshold, peak detector 304 instructs control-signal output mechanism 306 to output a control signal that places the PA driver and/or one or more VGAs in the high power back-off mode such that the to-be-transmitted block of symbols will be amplified and transmitted when the PA driver and/or VGAs are working in the high power back-off mode.

In one embodiment, control-signal output mechanism 306 outputs a control signal that is configured to increase the bias voltage to the PA driver and/or the bias voltage to the VGAs in response to the detection of a high PAPR. In a further embodiment, the bias voltage is increased to a predetermined higher value, such as twice the normal value. While operating in the high power back-off mode, the PA driver has a relatively large power back-off factor, which means the operating point of the PA driver is backed-off from the point that can produce the maximum average output power without distortion, or the 1 dB compression point (P1 dB). The power back-off factor needed is usually determined based on the PAPR value of the signal to be amplified/transmitted. For example, if the PAPR of the signal is 10 dB, then the power back-off factor needs to be at least 10 dB to avoid distortion. Note that the PAPR of the signal can be predetermined based on the currently active standard, or can be extracted from the baseband signal. Also note that while the operating point of the PA driver is adjusted based on the signal level, the overall gain of the PA driver remains substantially the same to ensure that the amplitude information of the signal is preserved.

While the PA driver and/or the VGAs are working in the high power back-off mode, peak detector 304 continues to monitor the level of the baseband signal and determines whether the overall signal level has returned to normal, which indicates the end of the peak. In one embodiment, peak detector 304 determines whether the overall level of a to-be-transmitted symbol is less than the predetermined threshold. If so, peak detector 304 instructs control-signal output mechanism 306 to output a control signal that places the PA driver and/or VGAs in the normal operating mode. In one embodiment, control-signal output mechanism 306 outputs a control signal configured to decrease the bias voltage to the PA driver and/or the bias voltage to the VGAs in response to peak detector 304 detecting the signal level returning to normal. In a further embodiment, the bias voltage is decreased to a predetermined lower value. When operating in the normal operating mode, the PA driver has a relatively small power back-off factor, which can be close to 0 dB, meaning no power back-off is needed.

Control-signal output mechanism 306 is responsible for outputting appropriate control signals to adjust the operating point of the PA driver. Note that different types of control signals may be needed for different types of PA drivers. For example, some PA drivers may require adjusting bias voltage, whereas others may require adjusting bias current.

Figure 4:
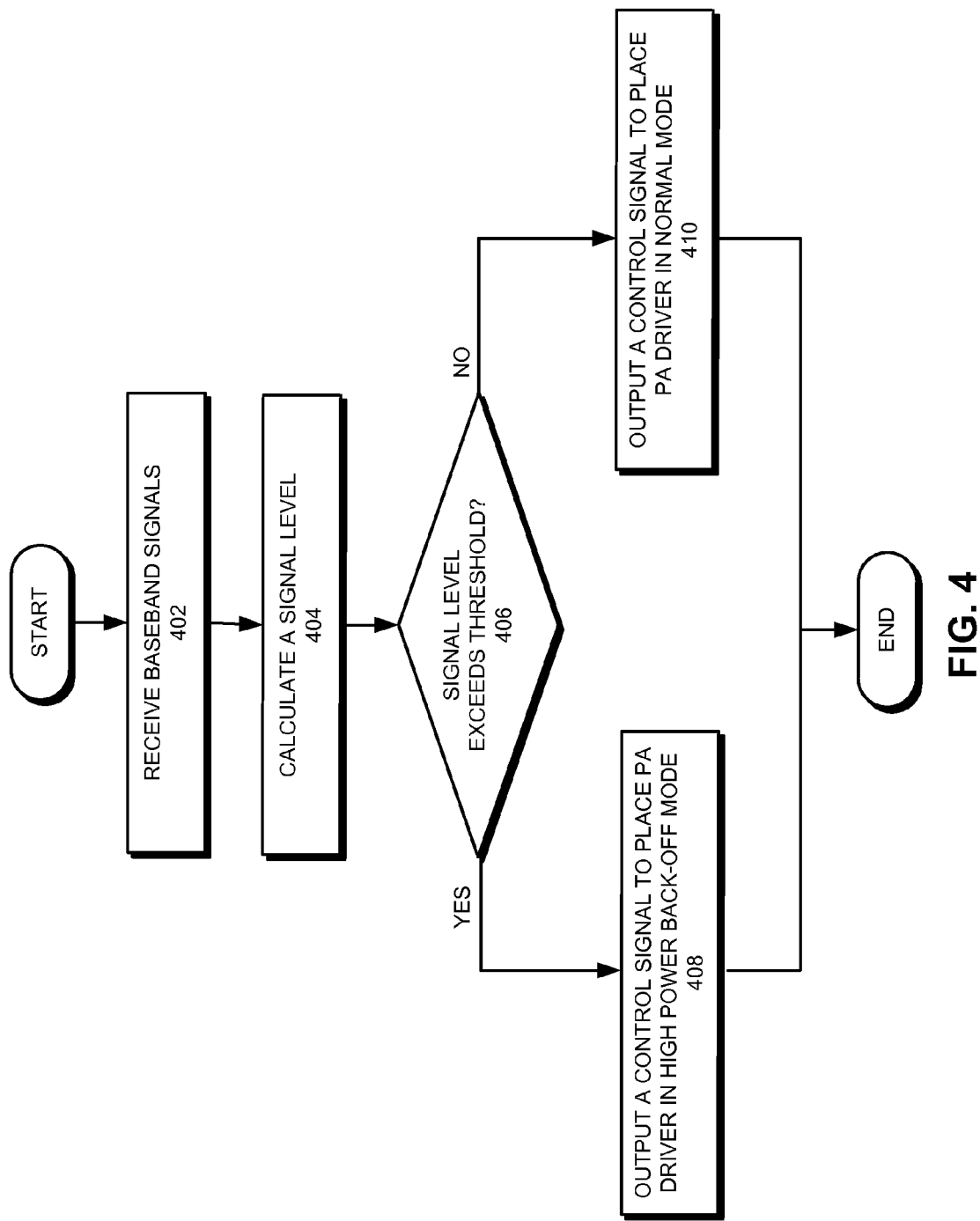
FIG. 4 presents a flowchart illustrating the process of controlling operations of a PA amplifier, in accordance with an embodiment of the present invention.

FIG. 4 presents a flowchart illustrating the process of controlling operations of a PA driver, in accordance with an embodiment of the present invention. During operation, the system receives baseband signals from the baseband DSP (operation 402). In one embodiment, the baseband signal may include one or more to-be transmitted symbols. The system then calculates an overall signal level (operation 404). The signal level can be expressed in terms of signal intensity or amplitude. In one embodiment, the system calculates the overall signal level for a to-be-transmitted symbol. In one more embodiment, the system calculates the average level or the PAPR for a block of to-be-transmitted symbols. Subsequently, the system determines whether the signal level or the PAPR exceeds a predetermined threshold (operation 406). If so, the system outputs a control signal to the PA driver to place the PA driver in a high power back-off mode (operation 408). Otherwise, the system outputs a control signal to the PA driver to place the PA driver in a normal operating mode (operation 410). Note that the control signals can be configured to adjust the bias voltage or bias current to the PA driver.

Note that the architectures shown in FIGS. 2 and 3, and the process shown in FIG. 4 are merely exemplary and should not limit the scope of this disclosure. For example, in FIG. 2, the transmitter implements a quadrature modulation scheme. In general, any type of modulation scheme is also possible. In addition, in FIG. 2, the transmitter controller is a standalone unit. In general, the transmitter controller can either be a standalone unit or a part of the baseband DSP. For example, the transmitter controller can be implemented as a function block in the baseband DSP. Moreover, FIG. 4 shows the PA driver being switched between two operation modes, the high power back-off mode and the normal mode. In general, it is also possible to fine-tune the operation point of the PA driver so that the PA driver switches among more than two operation modes. For example, it is also possible to include a medium power back-off mode, and when the signal level is in a medium range, the system places the PA driver in the medium power back-off mode.

Also note that, in embodiments of the present invention, the system adaptively switches the operating mode of the PA driver based on the signal level of the baseband signal, which is transmitted at a data rate much lower than the carrier frequency. As a result, the control circuit does not need to be a high-speed circuit; therefore, the proposed solution is readily implemented using various existing circuitry technologies. It is also optional to introduce a delay circuit in the transmitter controller to compensate for the time delay caused by DA-converting and modulating of the baseband signal.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A method for controlling operations of an amplifier in a wireless transmitter, comprising:
   receiving a to-be-transmitted baseband signal, wherein the to-be transmitted baseband signal includes a plurality of to-be-transmitted symbols;
   calculating a peak-to-average power ratio of the to-be-transmitted symbols;
   in response to determining that the peak-to-average power ratio of the to-be-transmitted symbols transitions from being less than a predetermined threshold to being greater than the predetermined threshold, configuring the amplifier to operate in a high power back-off mode having a first power back-off factor, which involves increasing a bias placed on the amplifier to reduce the amplifier's power efficiency in order to meet a linearity requirement; and
   in response to determining that the peak-to-average power ratio of the to-be-transmitted symbols transitions from being greater than the predetermined threshold to being less than the predetermined threshold, configuring the amplifier to operate in a normal mode having a second power back-off factor, wherein the second power back-off factor is less than the first power back-off factor.

2. The method of claim 1, further comprising:
   converting the to-be-transmitted baseband signal from a digital domain to an analog domain;
   modulating the converted baseband signal; and
   amplifying, by the amplifier, the modulated signal.

3. The method of claim 1, wherein increasing the bias placed on the amplifier involves increasing a bias voltage or a bias current.

4. The method of claim 1, wherein a difference between the first power back-off factor and the second power back-off factor is determined based on a currently active communication standard.

5. The method of claim 1, wherein the amplifier is a power amplifier (PA) driver, and wherein the PA driver is located on an RF integrated circuit (IC) chip that comprises at least a modulator.

6. The method of claim 1, wherein the to-be-transmitted baseband signal includes an orthogonal frequency-division multiplexing (OFDM) symbol.

7. An amplifier controller for controlling operations of an amplifier in a wireless transmitter, comprising:
   a receiving mechanism configured to receive a to-be-transmitted baseband signal, wherein the to-be-transmitted baseband signal includes a plurality of to-be-transmitted symbols;
   a calculating mechanism configured to calculate a peak-to-average power ratio of the to-be-transmitted symbols;
   a determination mechanism configured to determine whether the peak-to-average power ratio of the to-be-transmitted symbols transits from being less than a predetermined threshold to being greater than the predetermined threshold; and
   a control-signal output mechanism configured to, in response to the determination mechanism determining that the peak-to-average power ratio of the to-be-transmitted symbols transits from being less than the predetermined threshold to being greater than the predetermined threshold, output a control signal to configure the amplifier to operate in a high power back-off mode having a first power back-off factor, which involves increasing a bias placed on the amplifier to reduce the amplifier's power efficiency in order to meet a linearity requirement;
   wherein the control-signal output mechanism is further configured to, in response to the determination mechanism determining that the peak-to-average power ratio of the to-be-transmitted symbols transits from being greater than the predetermined threshold to being less than the predetermined threshold, output a control signal to configure the amplifier to operate in a normal mode having a second power back-off factor that is less than the first power back-off factor.

8. The amplifier controller of claim 7, wherein the control signal is configured to increase a bias voltage or a bias current of the amplifier.

9. The amplifier controller of claim 7, wherein a difference between the first power back-off factor and the second power back-off factor is determined based on a currently active communication standard.

10. The amplifier controller of claim 7, wherein the amplifier is a power amplifier (PA) driver, and wherein the PA driver is located on an RF integrated circuit (IC) chip that comprises at least a modulator.

11. The amplifier controller of claim 7, wherein the amplifier controller is part of a baseband digital signal processor (DSP) for the wireless transmitter.

12. The amplifier controller of claim 7, wherein the baseband signal includes an orthogonal frequency-division multiplexing (OFDM) symbol.

13. A wireless transmitter, comprising:
- an amplifier;
- a baseband digital signal processor (DSP);
- a digital-to-analog converter (DAC);
- a modulator; and
- an amplifier controller, wherein the amplifier controller further comprises:
  - a receiving mechanism configured to receive a to-be-transmitted baseband signal from the baseband DSP, wherein the to-be-transmitted baseband signal includes a plurality of to-be-transmitted symbols;
  - a calculating mechanism configured to calculate a peak-to-average power ratio of the to-be-transmitted symbols;
  - a determination mechanism configured to determine whether the peak-to-average power ratio of the to-be-transmitted symbols transits from being less than a predetermined threshold to being greater than the predetermined threshold; and
  - a control-signal output mechanism configured to, in response to the determination mechanism determining that the peak-to-average power ratio of the to-be-transmitted symbols transits from being less than the predetermined threshold to being greater than the predetermined threshold, output a control signal to configure the amplifier to operate in a high power back-off mode having a first power back-off factor, which involves increasing a bias placed on the amplifier to reduce to amplifier's power efficiency in order to meet a linearity requirement;
  - wherein the control-signal output mechanism is further configured to, in response to the determination mechanism determining that the peak-to-average power ratio of the to-be-transmitted symbols transits from being greater than the predetermined threshold to being less than the predetermined threshold, output a control signal to configure the amplifier to operate in a normal mode having a second power back-off factor that is less than the first power back-off factor.

14. The wireless transmitter of claim 13, wherein the DAC is configured to convert the to-be-transmitted baseband signal from a digital domain to an analog domain, wherein the modulator is configured to modulate the converted baseband signal, and wherein the amplifier is configured to amplify the modulated signal before sending the amplified signal to a power amplifier.

15. The wireless transmitter of claim 13, wherein the control signal is configured to increase a bias voltage or a bias current of the amplifier.

16. The wireless transmitter of claim 13, wherein a difference between the first power back-off factor and the second power back-off factor is determined based on a currently active communication standard.

17. The wireless transmitter of claim 13, wherein the modulator is a quadrature modulator.

18. The wireless transmitter of claim 13, wherein the amplifier controller is part of the baseband DSP.

19. The wireless transmitter of claim 13, wherein the amplifier and the modulator are located on a same integrated circuit (IC) chip.

20. The wireless transmitter of claim 13, wherein the baseband signal includes an orthogonal frequency-division multiplexing (OFDM) symbol.

\* \* \* \* \*